(12) United States Patent
Huang et al.

(10) Patent No.: US 9,968,001 B2
(45) Date of Patent: May 8, 2018

(54) HEAT DISSIPATION ASSEMBLY AND COMMUNICATIONS DEVICE

(71) Applicant: Huawei Technologies Co., Ltd., Shenzhen (CN)

(72) Inventors: Xingxing Huang, Shenzhen (CN); Kaikai Liu, Shanghai (CN); Shineng Chen, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days. days.

(21) Appl. No.: 15/356,103

(22) Filed: Nov. 18, 2016

(65) Prior Publication Data

US 2017/0150645 A1    May 25, 2017

(30) Foreign Application Priority Data

Nov. 20, 2015    (CN) .......................... 2015 1 0808794

(51) Int. Cl.
*H05K 7/20* (2006.01)
*F25B 21/02* (2006.01)
(Continued)

(52) U.S. Cl.
CPC ......... *H05K 7/20263* (2013.01); *F25B 21/02* (2013.01); *G02B 6/42* (2013.01); *G02B 6/4266* (2013.01); *G02B 6/4268* (2013.01); *G02B 6/4271* (2013.01); *H05K 5/0026* (2013.01); *H05K 7/2049* (2013.01);
(Continued)

(58) Field of Classification Search
CPC ....................................................... H01L 23/34

USPC ....................... 361/679.46–679.54, 688–723; 165/80.1–80.3; 257/718–719; 24/453, 24/458–459

See application file for complete search history.

(56) References Cited

U.S. PATENT DOCUMENTS

| | | | |
|---|---|---|---|
| 2003/0161108 A1* | 8/2003 | Bright | G02B 6/4201 361/707 |
| 2005/0152663 A1* | 7/2005 | Bench | G02B 6/4201 385/147 |

(Continued)

FOREIGN PATENT DOCUMENTS

| | | |
|---|---|---|
| CN | 103123509 A | 5/2013 |
| EP | 2983457 A1 | 2/2016 |

(Continued)

*Primary Examiner* — Dion R Ferguson
*Assistant Examiner* — Amir Jalali
(74) *Attorney, Agent, or Firm* — Leydig, Voit & Mayer, Ltd.

(57) ABSTRACT

Embodiments of the present invention disclose a heat dissipation assembly including: a cage, a TEC assembly, a mounting kit, an elastic carrier, and a heat pipe, where a window is provided in a side face of the cage, the TEC assembly is located on an outer side of the cage, and a cold side of the TEC assembly passes through the window and thermally communicates with the heat emitting device in the cage; the mounting kit is configured to mount the TEC assembly and enable the TEC assembly to move in a direction leaving or approaching the heat emitting device; and a heat absorption portion of the heat pipe is mounted on the elastic carrier, and the heat absorption portion that is of the heat pipe and that is mounted on the elastic carrier thermally communicates with a hot side of the TEC assembly.

22 Claims, 4 Drawing Sheets

(51) Int. Cl.
*G02B 6/42* (2006.01)
*H05K 5/00* (2006.01)

(52) U.S. Cl.
CPC ..... *H05K 7/20281* (2013.01); *H05K 7/20336* (2013.01); *H05K 7/20445* (2013.01); *F25B 2321/023* (2013.01); *F25B 2321/0251* (2013.01); *F25B 2321/0252* (2013.01)

(56) References Cited

U.S. PATENT DOCUMENTS

| | | | |
|---|---|---|---|
| 2005/0220425 A1* | 10/2005 | Kropp | G02B 6/4292 385/88 |
| 2011/0142086 A1* | 6/2011 | Watanabe | H01S 5/02415 372/34 |
| 2012/0192574 A1* | 8/2012 | Ghoshal | F25B 21/02 62/3.2 |
| 2013/0279115 A1 | 10/2013 | Blumenthal | |
| 2014/0318152 A1* | 10/2014 | Ghoshal | F25B 21/02 62/3.2 |
| 2016/0109670 A1* | 4/2016 | Huang | G02B 6/4272 361/707 |

FOREIGN PATENT DOCUMENTS

| | | | |
|---|---|---|---|
| EP | 2990845 A1 | 3/2016 | |
| WO | WO 2014187078 A1 | 11/2014 | |
| WO | WO 2015074366 A1 | 5/2015 | |

\* cited by examiner

HEAT DISSIPATION ASSEMBLY AND COMMUNICATIONS DEVICE

CROSS-REFERENCE TO RELATED APPLICATION

This application claims priority to Chinese Patent Application No. 201510808794.9, filed on Nov. 20, 2015, the disclosure of which is hereby incorporated by reference in its entirety.

TECHNICAL FIELD

The present invention relates to the field of electronic communications technologies, and in particular, to a heat dissipation assembly and a communications device.

BACKGROUND

In a radio frequency module, an optical module is commonly used as various interfaces, such as a service interface, a transmission interface, and an interconnection interface. With development of communications technologies, a rate and bandwidth of an optical module continuously increase, and consequently, power consumption of the optical module increases, and the optical module generates an increasing amount of heat. Therefore, the optical module has an increasingly high requirement for heat dissipation efficiency.

SUMMARY

In view of this, embodiments of the present invention provide a heat dissipation assembly and a communications device using the heat dissipation assembly, to implement efficient heat dissipation for an optical module.

According to a first aspect, an embodiment of the present invention provides a heat dissipation assembly, configured to dissipate heat for a heat emitting device, where the heat dissipation assembly includes: a cage, a thermal electric cooling (TEC) assembly, a mounting kit, an elastic carrier, and a heat pipe, where a window is provided in a side face of the cage, the TEC assembly is located on an outer side of the cage, and a cold side of the TEC assembly passes through the window and thermally communicates with the heat emitting device in the cage, so as to dissipate heat of the heat emitting device; the mounting kit is configured to mount the TEC assembly and enable the TEC assembly to move in a direction leaving or approaching the heat emitting device; and a heat absorption portion of the heat pipe is mounted on the elastic carrier, and the heat absorption portion that is of the heat pipe and that is mounted on the elastic carrier thermally communicates with a hot side of the TEC assembly, so as to dissipate heat of the TEC assembly by using the heat pipe, where a side of the elastic carrier facing away from the TEC assembly presses against a caging device, and the elastic carrier is configured to: when the heat emitting device is inserted into the cage and applies an extrusion force to the outer side of the cage, and the extrusion force is transferred to the TEC assembly through the window and transferred to the elastic carrier from the TEC assembly, undergo elastic deformation and provide a reaction force to the TEC assembly and the heat emitting device.

When an ambient temperature of the heat emitting device is excessively high, the TEC assembly absorbs heat from the heat emitting device on the cold side of the TEC assembly by means of a thermal electric effect, and releases heat on the hot side, so as to form a local cold area surrounding the heat emitting device and help meet a requirement of the heat emitting device for an operating temperature.

When the heat emitting device is inserted into the cage, the heat emitting device and the cold side of the TEC assembly undergo a press fit. The heat emitting device pushes the TEC assembly, and then the TEC assembly moves in a direction leaving the heat emitting device, causing that the elastic carrier that carries the heat pipe also moves in the direction leaving the heat emitting device. The elastic carrier is compressed to generate a rebound force in a direction towards the heat emitting device, enabling the cold side of the TEC assembly to be in close contact with the heat emitting device, or, in a case in which a thermally conductive medium is provided between the cold side of the TEC assembly and the heat emitting device, enabling the cold side of the TEC assembly to be in close contact with the thermally conductive medium and enabling the thermally conductive medium to be in close contact with the heat emitting device. Therefore, thermal resistance between the cold side of the TEC assembly and the heat emitting device is relatively small, and good thermal conduction is implemented. In addition, the rebound force also enables the heat absorption portion of the heat pipe to be in close contact with the hot side of the TEC assembly, or, in a case in which a thermally conductive medium is provided between the heat absorption portion of the heat pipe and the hot side of the TEC assembly, enables the heat absorption portion of the heat pipe to be in close contact with the thermally conductive medium, and enables the thermally conductive medium to be in close contact with the hot side of the TEC assembly. Therefore, thermal resistance between the heat pipe and the hot side of the TEC assembly is also relatively small. In summary, when the heat emitting device is inserted into the cage, under the action of the rebound force of the elastic carrier, contact thermal resistance is relatively small in a thermal conduction path from the heat emitting device to the TEC assembly and from the TEC assembly to the heat pipe, facilitating dissipation of the heat generated by the heat emitting device.

When the heat emitting device is removed from the cage, the elastic carrier recovers from deformation, and the TEC assembly moves in a direction towards the cage and recovers to an original location.

In the thermal conduction path from the heat emitting device to the TEC assembly and from the TEC assembly to the heat pipe, for a reason that absolutely precise machining of a device is impossible, each device in the thermal conduction path may have a machining tolerance. Therefore, a larger quantity of devices in the thermal conduction path indicates a greater accumulated tolerance, and existence of a tolerance causes a phenomenon that devices cannot closely fit in with each other.

When the heat emitting device is inserted into the cage, under the action of the rebound force (or may be referred to as a resilience force) of the elastic carrier, the tolerance between devices may be compensated, facilitating close fitting between the devices. In this way, the contact thermal resistance is relatively small, facilitating dissipation of the heat generated by the heat emitting device.

Correspondingly, in a case in which the heat emitting device is an optical module, the heat dissipation assembly may also efficiently dissipate heat for the optical module in the foregoing manner.

In a first possible implementation manner of the first aspect, the elastic carrier includes a carrying base, and a material of the carrying base is an elastic material.

With reference to the first aspect or the first possible implementation manner of the first aspect, in a second possible implementation manner, there is one carrying base and at least one heat pipe, and the heat absorption portion of the at least one heat pipe is mounted on the one carrying base; or there are multiple carrying bases and multiple heat pipes, and the multiple heat pipes are mounted on the multiple carrying bases in a distributed manner.

With reference to the first aspect or the first possible implementation manner of the first aspect or the second possible implementation manner of the first aspect, in a third possible implementation manner, the heat absorption portion of the heat pipe is mounted onto a side face of the carrying base; or the heat absorption portion of the heat pipe is mounted in a receiving groove cut in the carrying base; or the heat absorption portion of the heat pipe is embedded in the carrying base.

With reference to the first aspect or the first possible implementation manner of the first aspect or the second possible implementation manner of the first aspect or the third possible implementation manner of the first aspect, in a fourth possible implementation manner, a part that is of the heat absorption portion of the heat pipe and that protrudes from the carrying base contacts the hot side of the TEC assembly; or a thermal pad is used to conduct heat between a part that is of the heat absorption portion of the heat pipe and that protrudes from the carrying base and the hot side of the TEC assembly; or the carrying base is used to conduct heat between the heat absorption portion of the heat pipe and the hot side of the TEC assembly, where the carrying base is a thermal conductor; or a thermally conductive medium provided in the carrying base is used to conduct heat between the heat absorption portion of the heat pipe and the hot side of the TEC assembly.

In a fifth possible implementation manner of the first aspect, the elastic carrier includes a holding base, and an elastic member located on a side of the holding base facing away from the TEC assembly.

With reference to the first aspect or the fifth possible implementation manner of the first aspect, in a sixth possible implementation manner, there is one holding base and at least one heat pipe, and the heat absorption portion of the at least one heat pipe is mounted on the one holding base; or there are multiple holding bases and multiple heat pipes, and the multiple heat pipes are mounted on the multiple holding bases in a distributed manner.

With reference to the first aspect or the fifth possible implementation manner of the first aspect or the sixth possible implementation manner of the first aspect, in a seventh possible implementation manner, the heat absorption portion of the heat pipe is mounted onto a side face of the holding base; or the heat absorption portion of the heat pipe is mounted in a receiving groove cut in the holding base; or the heat absorption portion of the heat pipe is embedded in the holding base.

With reference to the first aspect or the fifth possible implementation manner of the first aspect or the sixth possible implementation manner of the first aspect or the seventh possible implementation manner of the first aspect, in an eighth possible implementation manner, a part that is of the heat absorption portion of the heat pipe and that protrudes from the holding base contacts the hot side of the TEC assembly; or a thermal pad is used to conduct heat between a part that is of the heat absorption portion of the heat pipe and that protrudes from the holding base and the hot side of the TEC assembly; or the holding base is used to conduct heat between the heat absorption portion of the heat pipe and the hot side of the TEC assembly, where the holding base is a thermal conductor; or a thermally conductive medium provided in the holding base is used to conduct heat between the heat absorption portion of the heat pipe and the hot side of the TEC assembly.

With reference to the first aspect or any one of the first to the eighth possible implementation manners of the first aspect, in a ninth possible implementation manner, that a side of the elastic carrier facing away from the TEC assembly presses against a caging device specifically includes:

the caging device is a heat sink, the elastic carrier is a thermal conductor, the side of the elastic carrier facing away from the TEC assembly presses against the heat sink, and the hot side of the TEC assembly transfers heat to the heat sink through the elastic carrier.

With reference to the first aspect or any one of the first to the ninth possible implementation manners of the first aspect, in a tenth possible implementation manner, the heat absorption portion of the heat pipe is located at one end of the heat pipe, or at any section of the entire heat pipe.

With reference to the first aspect or any one of the first to the tenth possible implementation manners of the first aspect, in an eleventh possible implementation manner, the mounting kit is mounted on the outer side of the cage.

Mounting the mounting kit on the outer side of the cage helps implement good thermal conduction between the cold side of the TEC assembly and the heat emitting device. In addition, mounting the mounting kit on the outer side of the cage enables the TEC assembly to be fastened quickly and conveniently to the cage, which makes assembling easy.

With reference to the first aspect or any one of the first to the eleventh possible implementation manners, in a twelfth possible implementation manner, the mounting kit is a fastener, the fastener includes two oppositely disposed fastening plates and at least two elastic arms that are connected between the two fastening plates, one elastic arm of the at least two elastic arms is connected on the top of one end of the two fastening plates, and another elastic arm of the at least two elastic arms is connected on the top of the other end of the two fastening plates.

With reference to the twelfth possible implementation manner of the first aspect, in a thirteenth possible implementation manner, the fastening plates of the fastener are mounted on outer faces of two opposite side walls of the cage.

With reference to the twelfth possible implementation manner of the first aspect or the thirteenth possible implementation manner of the first aspect, in a fourteenth possible implementation manner, the elastic arms of the fastener fasten the TEC assembly on the outer side of the cage.

With reference to the twelfth possible implementation manner of the first aspect or the thirteenth possible implementation manner of the first aspect or the fourteenth possible implementation manner of the first aspect, in a fifteenth possible implementation manner, the at least two elastic arms of the fastener press against a metal base of the TEC assembly, where a part of the metal base protrudes from at least two opposite sides of the TEC assembly, and the elastic arms of the fastener press against the protruding part of the metal base.

With reference to the first aspect or any one of the first to the tenth possible implementation manners of the first aspect, in a sixteenth possible implementation manner, the mounting kit includes at least two support bars and at least one elastic beam, the elastic beam presses against the TEC assembly, the at least two support bars are connected to the elastic beam at one end, the support bars are mounted on a circuit board at the other end, and the cage is also mounted on the circuit board.

Mounting the mounting kit on the circuit board is easy and firm and facilitates removal.

With reference to the sixteenth possible implementation manner of the first aspect, in a seventeenth possible implementation manner, the elastic beam presses against a metal base of the TEC assembly, where a part of the metal base protrudes from at least two opposite sides of the TEC assembly, and the elastic beam presses against the protruding part of the metal base.

With reference to the first aspect or any one of the first to the seventeenth possible implementation manners of the first aspect, in an eighteenth possible implementation manner, that a window is provided in a side face of the cage specifically includes:

the window is provided on the top of the cage.

Correspondingly, that the TEC assembly is located on an outer side of the cage includes:

the TEC assembly is located on the top outer side of the cage.

With reference to the first aspect or any one of the first to the eighteenth possible implementation manners of the first aspect, in a nineteenth possible implementation manner, a location of the window is near an opening end of the cage, and the heat emitting device is inserted into the cage through the opening. In a case in which the heat emitting device is an optical module, the design allows the TEC assembly to better cool a TOSA (transmitter optical subassembly) device or a ROSA (receiver optical subassembly) device that is of the optical module and that is near a location of the opening of the cage.

With reference to the first aspect or any one of the first to the nineteenth possible implementation manners of the first aspect, in a twentieth possible implementation manner, that a cold side of the TEC assembly passes through the window and thermally communicates with the heat emitting device in the cage specifically includes:

the cold side of the TEC assembly passes through the window and thermally communicates with a surface of the heat emitting device in the cage.

With reference to the first aspect or any one of the first to the twentieth possible implementation manners of the first aspect, in a twenty-first possible implementation manner, that a cold side of the TEC assembly passes through the window and thermally communicates with the heat emitting device in the cage specifically includes:

the cold side of the TEC assembly passes through the window and thermally communicates with the top surface of the heat emitting device in the cage.

With reference to the first aspect or any one of the first to the twenty-first possible implementation manners of the first aspect, in a twenty-second possible implementation manner, that a cold side of the TEC assembly passes through the window and thermally communicates with the heat emitting device in the cage specifically includes:

the cold side of the TEC assembly passes through the window and contacts a surface of the heat emitting device in the cage; or a thermal pad is provided between the cold side of the TEC assembly and a surface of the heat emitting device, and the cold side of the TEC assembly passes through the window and dissipates heat of the heat emitting device by using the thermal pad.

Thermal resistance between the cold side of the TEC assembly and the heat emitting device may be decreased by providing the thermal pad. In addition, when all members in the heat dissipation assembly are mounted together, tolerances of all devices in the heat dissipation assembly may be absorbed by means of deformation of the thermal pad. In addition, when the heat emitting device is inserted into the cage, an extrusion force exerted by the heat emitting device may also cause deformation of the thermal pad; and therefore, the thermal pad can further absorb a displacement of the TEC assembly or the like caused when the heat emitting device is inserted or removed.

With reference to the first aspect or any one of the first to the twenty-second possible implementation manners of the first aspect, in a twenty-third possible implementation manner, that the heat absorption portion that is of the heat pipe and that is mounted on the elastic carrier thermally communicates with a hot side of the TEC assembly includes:

the heat absorption portion that is of the heat pipe and that is mounted on the elastic carrier contacts the hot side of the TEC assembly; or a thermally conductive medium is used to conduct heat between the heat absorption portion that is of the heat pipe and that is mounted on the elastic carrier and the hot side of the TEC assembly.

With reference to the first aspect or any one of the first to the twenty-third possible implementation manners of the first aspect, in a twenty-fourth possible implementation manner, the heat emitting device is an optical module.

With reference to the first aspect or any one of the first to the twenty-fourth possible implementation manners of the first aspect, in a twenty-fifth possible implementation manner, the heat dissipation assembly further includes the heat emitting device, and the heat emitting device is located in the cage of the heat dissipation assembly.

According to a second aspect, an embodiment of the present invention provides an optical module assembly, including an optical module, a connector, and the heat dissipation assembly according to the foregoing first aspect or any one of the first to the twenty-fourth possible implementation manners of the first aspect, where the optical module serves as the heat emitting device of the heat dissipation assembly according to the foregoing first aspect or any one of the first to the twenty-fourth possible implementation manners of the first aspect, the optical module and the connector are located in the cage of the heat dissipation assembly, and the optical module and the connector are communicatively connected.

According to a third aspect, an embodiment of the present invention provides a communications device, where the communications device includes a housing, a circuit board, a connector, and the heat dissipation assembly according to the foregoing first aspect or any one of the first to the eighth and the tenth to the twenty-fifth possible implementation manners of the first aspect, where the circuit board, the connector, and the heat dissipation assembly are located in the housing, the connector and the cage are disposed on a same surface of the circuit board, the connector is located in the cage at one end of the cage, and the heat emitting device is inserted into the cage from an end of the cage facing away from the connector and is communicatively connected to the connector.

With reference to the third aspect, in a first possible implementation manner, the housing serves as the caging device in the heat dissipation assembly according to the foregoing first aspect or any one of the first to the eighth and the tenth to the twenty-fifth possible implementation manners of the first aspect, and the side of the elastic carrier facing away from the TEC assembly presses against the housing.

With reference to the third aspect, in a second possible implementation manner, the housing includes a top structure box and a bottom structure box, the top structure box serves as the caging device in the heat dissipation assembly according to the foregoing first aspect or any one of the first to the eighth and the tenth to the twenty-fifth possible implementation manners of the first aspect, and the side of the elastic carrier facing away from the TEC assembly presses against the top structure box.

With reference to the third aspect, in a third possible implementation manner, the communications device further includes a heat sink, the heat sink serves as the caging device in the heat dissipation assembly according to the foregoing first aspect or any one of the first to the eighth and the tenth to the twenty-fifth possible implementation manners of the first aspect, the elastic carrier is a thermal conductor, the side of the elastic carrier facing away from the TEC assembly presses against the heat sink, and the hot side of the TEC assembly transfers heat to the heat sink through the elastic carrier.

With reference to the third aspect or the first possible implementation manner of the third aspect or the second possible implementation manner of the third aspect or the third possible implementation manner of the third aspect, in a fourth possible implementation manner, a heat emission portion of the heat pipe thermally communicates with the housing.

With reference to the third aspect or the first possible implementation manner of the third aspect or the second possible implementation manner of the third aspect or the third possible implementation manner of the third aspect or the fourth possible implementation manner of the third aspect, in a fifth possible implementation manner, the heat emission portion of the heat pipe may be located at one end of the heat pipe, or at any section of the entire heat pipe.

Figure 1:
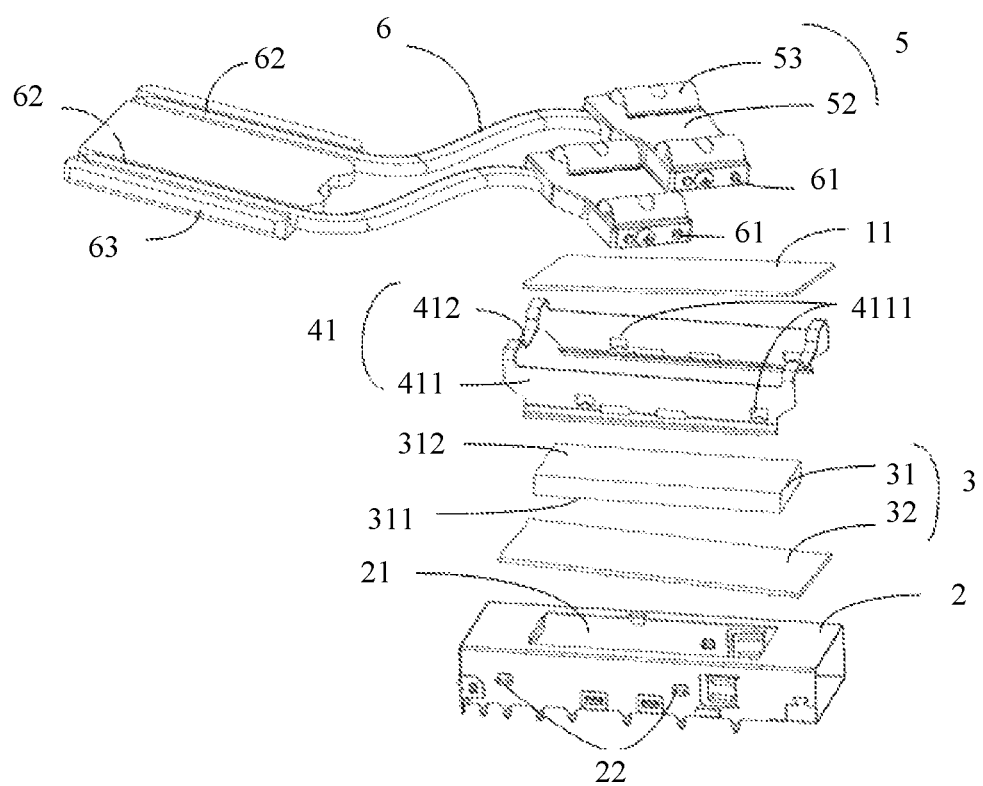
FIG. 1 is a schematic diagram of an embodiment of a heat dissipation assembly according to the present invention.

Cage 2; window 21; second buckle structure 22; TEC assembly 3; TEC chip 31; first ceramic sheet 311; second ceramic sheet 312; metal base 32; second connector 33; small circuit board 35; mounting kit 4; fastener 41; fastening plate 411; first buckle structure 4111; elastic arm 412; support bar 42; elastic beam 43; elastic carrier 5; carrying base 51; holding base 52; elastic member 53; heat pipe 6; heat absorption portion 61; heat emission portion 62; heat dissipation block 63; heat emitting device 7; caging device 8; communications device 9; housing 91; top structure box 911; bottom structure box 912; circuit board 92; first connector 93; and thermal pad 11

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Heat Dissipation Assembly (without an Optical Module)

Figure 2:
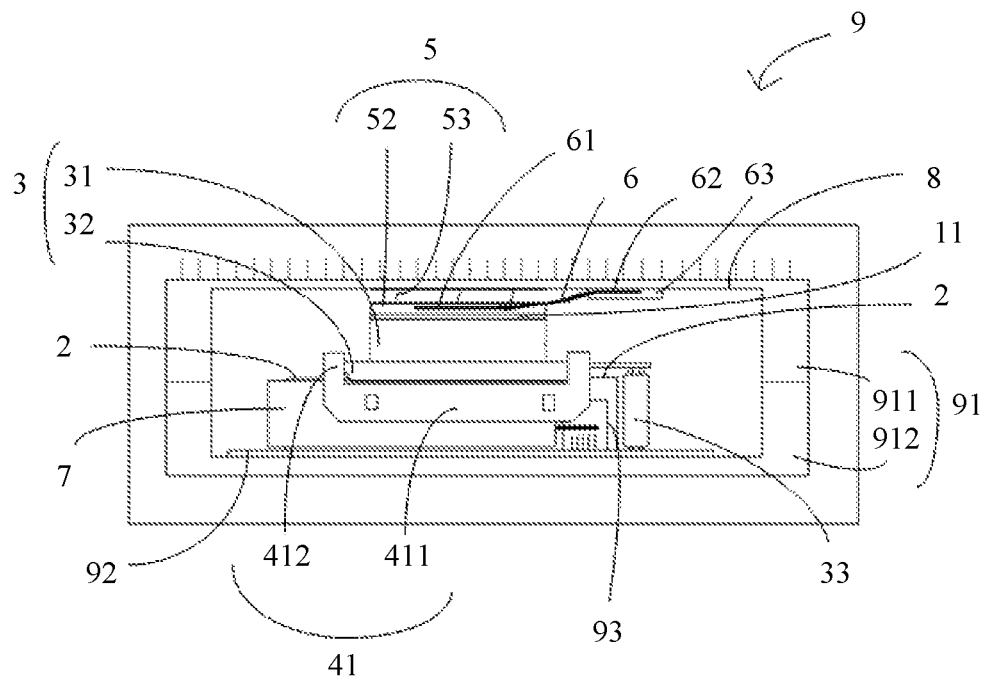
FIG. 2 is a schematic diagram of an embodiment of a communications device according to the present invention.
Figure 3:
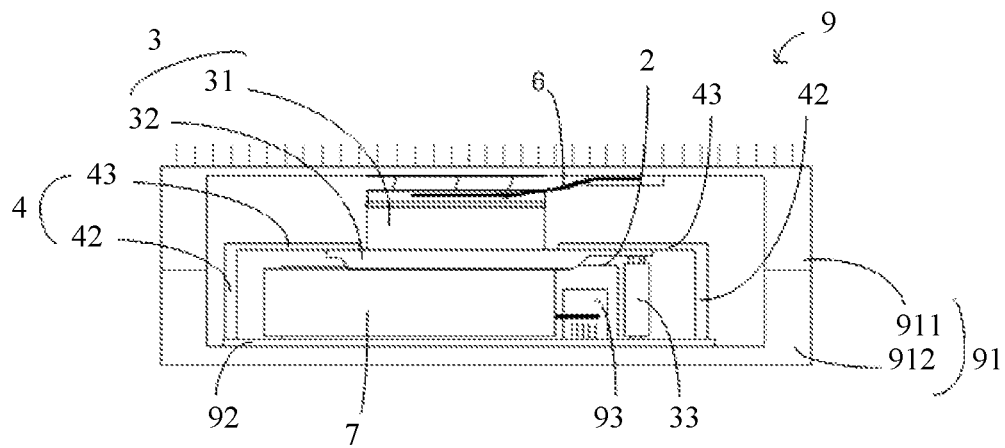
FIG. 3 is a schematic diagram of an embodiment of another communications device according to the present invention.

Referring to FIG. 1 to FIG. 3, an embodiment of the present invention provides a heat dissipation assembly, configured to dissipate heat for a heat emitting device 7, where the heat dissipation assembly includes: a cage 2, a TEC (Thermal Electrical Cooling, thermal electric cooling) assembly 3, a mounting kit 4, an elastic carrier, and a heat pipe 6, where a window 21 is provided in a side face of the cage 2, the TEC assembly 3 is located on an outer side of the cage 2, and a cold side of the TEC assembly 3 passes through the window 21 and thermally communicates with the heat emitting device 7 in the cage 2, so as to dissipate heat of the heat emitting device 7; the mounting kit 4 is configured to mount the TEC assembly 3 and enable the TEC assembly 3 to move in a direction leaving or approaching the heat emitting device 7; and a heat absorption portion 61 of the heat pipe 6 is mounted on the elastic carrier 5, and the heat absorption portion 61 of the heat pipe 6 that is mounted on the elastic carrier 5 thermally communicates with a hot side of the TEC assembly 3, so as to dissipate heat of the TEC assembly 3 by using the heat pipe 6, where a side of the elastic carrier 5 facing away from the TEC assembly 3 presses against a caging device 8, and the elastic carrier 5 is configured to: when the heat emitting device 7 is inserted into the cage 2 and applies an extrusion force to the outer side of the cage 2, and the extrusion force is transferred to the TEC assembly 3 through the window 21 and transferred to the elastic carrier 5 from the TEC assembly 3, undergo elastic deformation and provide a reaction force to the TEC assembly 3 and the heat emitting device 7.

It should be noted that, for easy illustration of an internal structure of the cage 2, FIG. 2 and FIG. 3 only show a cutaway view of the cage 2 at a location of the window 21, which may also be easily understood as: a side wall of the cage 2 facing the reader is cut away. For a complete structure of the cage 2, refer to FIG. 1.

In the foregoing embodiment of the present invention, when an ambient temperature of the heat emitting device is excessively high, the TEC assembly absorbs heat from the heat emitting device on the cold side of the TEC assembly by means of a thermal electric effect, and releases heat on the hot side, so as to form a local cold area surrounding the heat emitting device and help meet a requirement of the heat emitting device for an operating temperature.

When the heat emitting device is inserted into the cage, the heat emitting device and the cold side of the TEC assembly undergo a press fit. The heat emitting device pushes the TEC assembly, and then the TEC assembly moves in a direction leaving the heat emitting device, causing that the elastic carrier that carries the heat pipe also moves in the direction leaving the heat emitting device. The elastic carrier is compressed to generate a rebound force in a direction towards the heat emitting device, enabling the cold side of the TEC assembly to be in close contact with the heat emitting device, or, in a case in which a thermally conductive medium is provided between the cold side of the TEC assembly and the heat emitting device, enabling the cold side of the TEC assembly to be in close contact with the thermally conductive medium and enabling the thermally conductive medium to be in close contact with the heat emitting device. Therefore, thermal resistance between the cold side of the TEC assembly and the heat emitting device is relatively small, and good thermal conduction is implemented. In addition, the rebound force also enables the heat absorption portion of the heat pipe to be in close contact with the hot side of the TEC assembly, or, in a case in which a thermally conductive medium is provided between the heat absorption portion of the heat pipe and the hot side of the TEC assembly, enables the heat absorption portion of the heat pipe to be in close contact with the thermally conductive medium, and enables the thermally conductive medium to be in close contact with the hot side of the TEC assembly. Therefore, thermal resistance between the heat pipe and the hot side of the TEC assembly is also relatively small. In summary, when the heat emitting device is inserted into the cage, under the action of the rebound force of the elastic carrier, contact thermal resistance is relatively small in a thermal conduction path from the heat emitting device to the TEC assembly and from the TEC assembly to the heat pipe, facilitating dissipation of the heat generated by the heat emitting device.

When the heat emitting device is removed from the cage, the elastic carrier recovers from deformation, and the TEC assembly moves in a direction towards the cage and recovers to an original location.

In the thermal conduction path from the heat emitting device to the TEC assembly and from the TEC assembly to the heat pipe, for a reason that absolutely precise machining of a device is impossible, each device in the thermal conduction path may have a machining tolerance. Therefore, a larger quantity of devices in the thermal conduction path indicates a greater accumulated tolerance, and existence of a tolerance causes a phenomenon that devices cannot closely fit in with each other.

When the heat emitting device is inserted into the cage, under the action of the rebound force (or may be referred to as a resilience force) of the elastic carrier, the tolerance between devices may be compensated, facilitating close fitting between the devices. In this way, the contact thermal resistance is relatively small, facilitating dissipation of the heat generated by the heat emitting device. In the foregoing embodiment of the present invention, the heat emitting device may be an optical module. In a case in which the heat emitting device is an optical module, the heat dissipation assembly may efficiently dissipate heat for the optical module in the foregoing manner.

(1) Regarding a Specific Structure of the Window of the Cage and the Mounting Kit:

Referring to FIG. 1, in a specific implementation manner of the foregoing embodiment of the present invention, the mounting kit 4 is a fastener 41, and the fastener 41 may be mounted on the outer side of the cage 2. The fastener 41 is mounted on the outer side of the cage 2, helping implement good thermal conduction between the cold side of the TEC assembly 3 and the heat emitting device.

The fastener 41 includes two oppositely disposed fastening plates 411 and at least two elastic arms 412 that are connected between the two fastening plates 411. One elastic arm 412 of the at least two elastic arms 412 is connected on the top of one end of the two fastening plates 411, and another elastic arm 412 of the at least two elastic arms 412 is connected on the top of the other end of the two fastening plates 411.

At least one first buckle structure 4111 is provided on the fastening plates 411. At least one second buckle structure 22 is correspondingly provided on outer faces of two opposite side walls of the cage 2.

Referring to FIG. 2, the fastener 41 is mounted over the cage 2 on the outer side; the at least two elastic arms 412 of the fastener 41 press against the TEC assembly 3; the at least one first buckle structure of the two fastening plates 411 of the fastener 41 correspondingly cooperates with the at least one second buckle structure on the outer faces of the cage respectively, so as to mount the fastener 41 on the outer side of the cage 2. In addition, the elastic arms 412 of the fastener 41 fasten the TEC assembly 3 on the outer side of the cage 2.

Optionally, the at least two elastic arms 412 of the fastener 41 press against a metal base 32 of the TEC assembly 3, where a part of the metal base 32 protrudes from at least two opposite sides of the TEC assembly 3, and the elastic arms 412 of the fastener 41 press against the protruding part of the metal base 32.

When the heat emitting device is inserted into the cage and pushes the TEC assembly, the TEC assembly moves in the direction leaving the heat emitting device, and the elastic arms of the fastener are elastically deformed. When the heat emitting device is removed from the cage, the TEC assembly recovers to an original location, and the elastic arms of the fastener recover from deformation.

Mounting the fastener on the outer side of the cage enables the TEC assembly to be fastened quickly and conveniently to the cage, which makes assembling easy.

Referring to FIG. 3, another implementation manner of the mounting kit 4 is: The mounting kit 4 includes at least two support bars 42 and at least one elastic beam 43, where the elastic beam 43 presses against the TEC assembly 3, the at least two support bars 42 are connected to the elastic beam 43 at one end, the support bars 42 are mounted on a circuit board 92 at the other end, and the cage is also mounted on the circuit board 92.

Optionally, the elastic beam 43 presses against a metal base 32 of the TEC assembly 3, where a part of the metal base 32 protrudes from at least two opposite sides of the TEC assembly 3, and the elastic beam 43 presses against the protruding part of the metal base 32.

When the heat emitting device is inserted into the cage and pushes the TEC assembly, the TEC assembly moves in the direction leaving the heat emitting device, and the elastic beam is squeezed by the TEC assembly and becomes elastically deformed. When the heat emitting device is removed from the cage, the TEC assembly recovers to an original location, and the elastic beam of the mounting kit recovers from deformation.

Mounting the mounting kit on the circuit board is easy and firm and facilitates removal.

Optionally, the support bars may be screws or bolts.

In a specific implementation manner of the foregoing embodiment, that a window is provided in a side face of the cage specifically includes:

the window is provided on the top of the cage (referring to FIG. 1).

Correspondingly, that the TEC assembly is located on an outer side of the cage includes:

the TEC assembly is located on the top outer side of the cage (referring to FIG. 2 or FIG. 3).

In a specific implementation manner, a location of the window may be near an opening end of the cage, and the heat emitting device is inserted into the cage through the opening. In a case in which the heat emitting device is an optical module, the design allows the TEC assembly to better cool a transmitter optical subassembly (TOSA) device or a receiver optical subassembly (ROSA) device that is of the optical module and that is near a location of the opening of the cage.

(2) Thermal Pad

In a specific implementation manner of the foregoing embodiment, that a cold side of the TEC assembly passes through the window and thermally communicates with the heat emitting device in the cage specifically includes:

the cold side of the TEC assembly passes through the window and thermally communicates with a surface of the heat emitting device in the cage.

More specifically, the cold side of the TEC assembly passes through the window and thermally communicates with the top surface of the heat emitting device in the cage.

In another specific implementation manner, that a cold side of the TEC assembly passes through the window and thermally communicates with the heat emitting device in the cage specifically includes:

the cold side of the TEC assembly passes through the window and contacts a surface of the heat emitting device in the cage; or a thermal pad is provided between the cold side of the TEC assembly and a surface of the heat emitting device, and the cold side of the TEC assembly passes through the window and dissipates heat of the heat emitting device by using the thermal pad.

Thermal resistance between the cold side of the TEC assembly and the heat emitting device may be decreased by providing the thermal pad.

The thermal pad may be a Thermal Interface Material (TIM) thermal pad.

In a specific implementation manner of the foregoing embodiment, that the heat absorption portion that is of the heat pipe and that is mounted on the elastic carrier thermally communicates with a hot side of the TEC assembly includes:

the heat absorption portion that is of the heat pipe and that is mounted on the elastic carrier contacts the hot side of the TEC assembly; or a thermally conductive medium is used to conduct heat between the heat absorption portion that is of the heat pipe and that is mounted on the elastic carrier and the hot side of the TEC assembly.

The thermally conductive medium may be a thermal pad; or the thermally conductive medium is the elastic carrier; or referring to FIG. 1 and FIG. 2, the thermally conductive medium includes a thermal pad 11 and the elastic carrier 5.

It can be seen from the foregoing descriptions that the elastic carrier that carries the heat pipe may absorb, by means of deformation, a tolerance and a displacement of the TEC assembly or the like caused when the heat emitting device is inserted or removed. Still further, a thermal pad may further be provided between the heat pipe and the TEC assembly and/or between the TEC assembly and the heat emitting device. When all members in the heat dissipation assembly are mounted together, the tolerance may be absorbed by means of deformation of the thermal pad. In addition, when the heat emitting device is inserted into the cage, an extrusion force exerted by the heat emitting device may also cause deformation of the thermal pad; and therefore, the thermal pad can further absorb the displacement of the TEC assembly or the like caused when the heat emitting device is inserted or removed.

Figure 5:
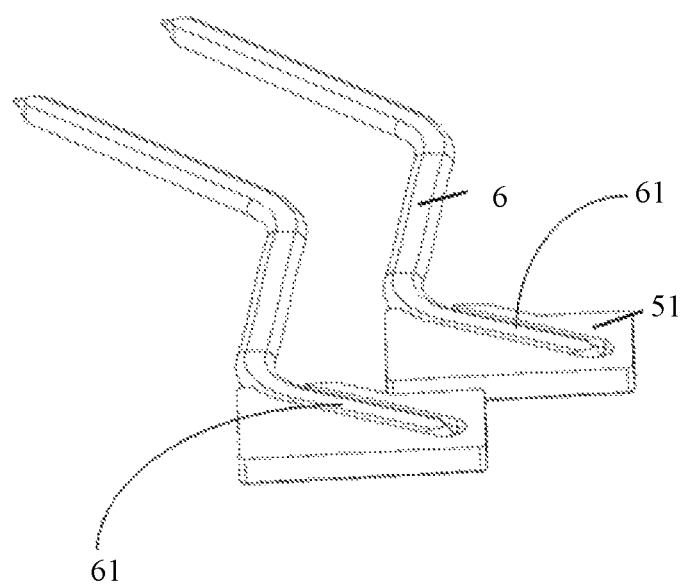
FIG. 5 is a schematic diagram of a mounting manner of a heat pipe and an elastic carrier in an embodiment of a heat dissipation assembly or a communications device according to the present invention.
Figure 6:
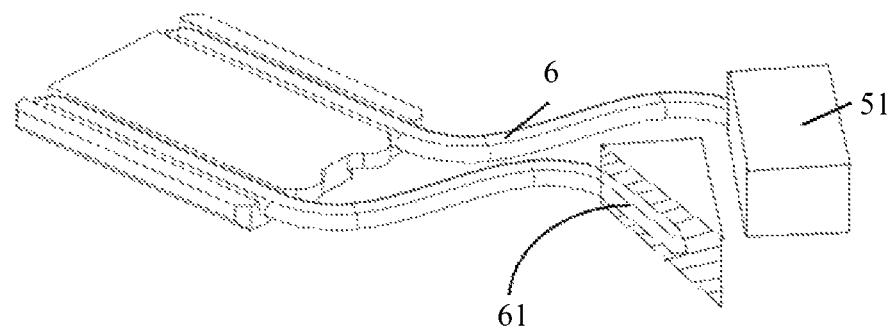
FIG. 6 is a schematic diagram of another mounting manner of a heat pipe and an elastic carrier in an embodiment of a heat dissipation assembly or a communications device according to the present invention.
Figure 7:
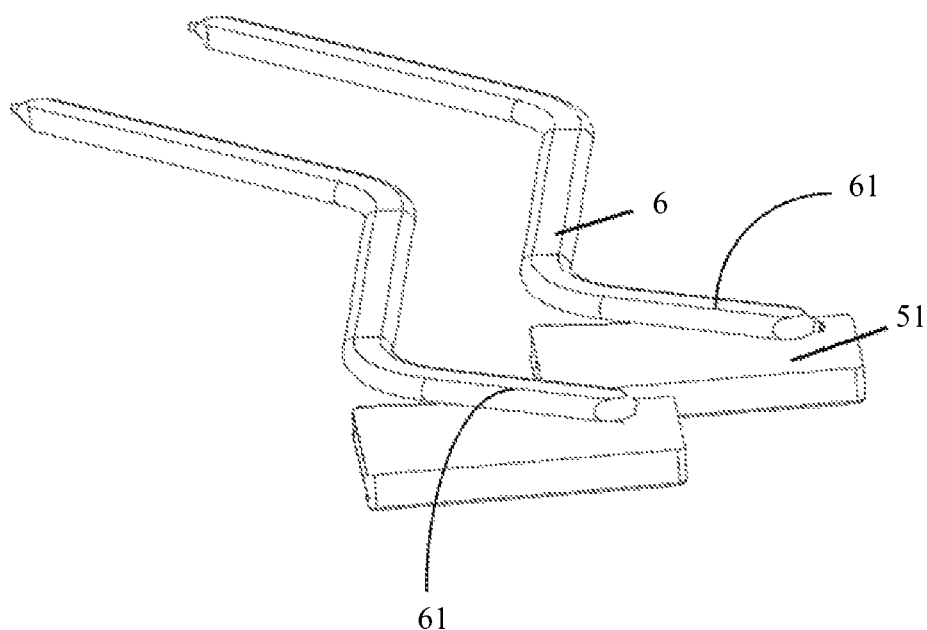
FIG. 7 is a schematic diagram of still another mounting manner of a heat pipe and an elastic carrier in an embodiment of a heat dissipation assembly or a communications device according to the present invention.

(3) A Structure of the Elastic Carrier, and Various Mounting Solutions for the Elastic Carrier and the Heat Pipe Referring to FIG. 5 to FIG. 7, in the foregoing embodiment, in a specific implementation manner of the elastic carrier, the elastic carrier may include a carrying base 51, where a material of the carrying base 51 is an elastic material. There may be one carrying base 51 and at least one heat pipe 6, and the heat absorption portion 61 of the at least one heat pipe 6 is mounted on the one carrying base 51; or there are multiple carrying bases 51 and multiple heat pipes 6, and the multiple heat pipes 6 are mounted on the multiple carrying bases 51 in a distributed manner. Referring to FIG. 7, the heat absorption portion 61 of the heat pipe 6 is mounted onto a side face of the carrying base 51; or referring to FIG. 5, the heat absorption portion 61 of the heat pipe 6 is mounted in a receiving groove cut in the carrying base 51; or referring to FIG. 6, the heat absorption portion 61 of the heat pipe 6 is embedded in the carrying base 51. A part of the heat absorption portion of the heat pipe may protrude from a surface of the carrying base; or the heat absorption portion of the heat pipe may be entirely located in the carrying base. A part that is of the heat absorption portion of the heat pipe and that protrudes from the carrying base contacts the hot side of the TEC assembly; or a thermal pad is used to conduct heat between a part that is of the heat absorption portion of the heat pipe and that protrudes from the carrying base and the hot side of the TEC assembly; or the carrying base is used to conduct heat between the heat absorption portion of the heat pipe and the hot side of the TEC assembly, where the carrying base is a thermal conductor; or a thermally conductive medium provided in the carrying base is used to conduct heat between the heat absorption portion of the heat pipe and the hot side of the TEC assembly.

In the foregoing embodiment, a shape of the carrying base may be a plate shape or a flat shape.

Referring to FIG. 1, in the foregoing embodiment of the present invention, in another specific implementation manner of the elastic carrier 5, the elastic carrier 5 may include a holding base 52, and an elastic member 53 located on a side of the holding base 52 facing away from the TEC assembly 3. There may be one holding base 52 and at least one heat pipe 6, and the heat absorption portion 61 of the at least one heat pipe 6 is mounted on the one holding base 52; or there are multiple holding bases 52 and multiple heat pipes 6, and the multiple heat pipes 6 are mounted on the multiple holding bases 52 in a distributed manner. In addition, similar to the previously described mounting manner of the heat pipe and the carrying base, the heat absorption portion of the heat pipe is mounted onto a side face of the holding base; or the heat absorption portion of the heat pipe is mounted in a receiving groove cut in the holding base; or the heat absorption portion of the heat pipe is embedded in the holding base. A part of the heat absorption portion of the heat pipe may protrude from a surface of the holding base; or the heat absorption portion of the heat pipe is entirely embedded in the holding base. A part that is of the heat absorption portion of the heat pipe and that protrudes from the holding base contacts the hot side of the TEC assembly; or a thermal pad is used to conduct heat between a part that is of the heat absorption portion of the heat pipe and that protrudes from the holding base and the hot side of the TEC assembly; or the holding base is used to conduct heat between the heat absorption portion of the heat pipe and the hot side of the TEC assembly, where the holding base is a thermal conductor; or a thermally conductive medium provided in the holding base is used to conduct heat between the heat absorption portion of the heat pipe and the hot side of the TEC assembly.

In the foregoing embodiment, a shape of the holding base may be a plate shape or a flat shape.

The elastic member may be a spring plate, a spring, or rubber. The elastic member may be a thermal conductor or a non-thermal conductor.

The elastic member may be fastened, by using screws, onto the side of the holding base facing away from the TEC assembly.

Corresponding to the two implementation manners of the elastic carrier, that a side of the elastic carrier facing away from the TEC assembly presses against a caging device specifically includes:

the caging device is a heat sink, the carrying base is a thermal conductor, the side of the carrying base facing away from the TEC assembly presses against the heat sink, and the hot side of the TEC assembly transfers heat to the heat sink through the carrying base; or the caging device is a heat sink, the holding base and the elastic member are thermal conductors, the elastic member presses against the heat sink, and the hot side of the TEC assembly transfers heat to the heat sink through the holding base and the elastic member.

(4) TEC Assembly

Referring to FIG. 1, in a feasible implementation manner of the foregoing embodiment, the TEC assembly 3 includes a TEC chip 31. The TEC chip 31 includes two oppositely disposed ceramic sheets and a semiconductor located and disposed between the two ceramic sheets. The two ceramic sheets are a first ceramic sheet 311 and a second ceramic sheet 312 respectively. The first ceramic sheet 311 may serve as the cold side, and the second ceramic sheet 312 may serve as the hot side.

Further, the TEC assembly 3 may further include a metal base 32. The metal base 32 is attached to a side of the first ceramic sheet 311 facing away from the semiconductor, and the metal base 32 serves as the cold side together with the first ceramic sheet 311.

The metal base passes through the window and thermally communicates with the heat emitting device. The metal base may be provided as a structure with a wide top and a narrow bottom. The narrow bottom may pass through the window, and the wide top may be left outside the window.

A thermal pad or another thermally conductive medium may further be provided on the first ceramic sheet 311. The thermal pad or the another thermally conductive medium may serve as the cold side of the TEC assembly together with the first ceramic sheet 311.

Further, the TEC assembly may further include a thermistor. The thermistor refers to a resistor whose resistance value changes regularly with the temperature. A function of the thermistor is to feed back a temperature of the cold side of the TEC chip to a circuit board or a control board, and then the circuit board or the control board adjusts input power of the TEC chip according to the temperature that is fed back. There are many manners for implementation of the thermistor. Another use of the thermistor is to reflect the temperature of the heat emitting device. Specifically, the thermistor may be disposed in the metal base.

Optical Module Assembly (with an Optical Module)

Referring to FIG. 2 and FIG. 3, an embodiment of the present invention further provides an optical module assembly, including the heat dissipation assembly in the foregoing embodiment, an optical module, and a first connector 93. The optical module serves as the heat emitting device 7 in the heat dissipation assembly in the foregoing embodiment, the optical module and the first connector 93 are located in the cage 2 of the heat dissipation assembly, and the optical module and the first connector 93 are communicatively connected.

Communications Device

Referring to FIG. 2 and FIG. 3, an embodiment of the present invention further provides a communications device 9. The communications device 9 includes a housing 91, a circuit board 92, a first connector 93, and the heat dissipation assembly in the foregoing embodiment, where the circuit board 92, the first connector 93, and the heat dissipation assembly are located in the housing 91. The first connector 93 and the cage 2 are disposed on a same surface of the circuit board 92, the first connector 93 is located in the cage 2 at one end of the cage 2, and the heat emitting device 7 is inserted into the cage 2 from an end of the cage 2 facing away from the first connector 93 and is communicatively connected to the first connector 93.

In an implementation manner of the foregoing embodiment of the present invention, the housing 91 may serve as the caging device 8 mentioned in the foregoing heat dissipation assembly embodiment, and the side of the elastic carrier 5 facing away from the TEC assembly 3 presses against the housing 91.

In an implementation manner of the foregoing embodiment of the present invention, a heat emission portion 62 of the heat pipe 6 thermally communicates with the housing 91.

The communications device in the foregoing embodiment of the present invention may be an remote radio unit (RRU).

Referring to FIG. 2 and FIG. 3, the communications device 9 in the foregoing embodiment of the present invention may further include the optical module. The optical module serves as the heat emitting device 7 in the heat dissipation assembly in the foregoing embodiment, and the optical module is located in the cage 2 of the heat dissipation assembly.

In the foregoing embodiment of the present invention, heat of the heat emission portion of the heat pipe is dissipated by using the housing. Further, the housing may be provided with a heat sink, and heat of the heat emission portion of the heat pipe is dissipated by using the housing and the heat sink.

Referring to FIG. 2, in the foregoing embodiment of the present invention, the housing 91 may include a top structure box 911 and a bottom structure box 912, and the side of the elastic carrier 5 facing away from the TEC assembly 3 presses against the top structure box 911. Heat of the heat emission portion 62 of the heat pipe 6 is dissipated by using the top structure box 911. Further, the top structure box 911 may be provided with a heat sink, and heat of the heat emission portion 62 of the heat pipe 6 is dissipated by using the top structure box 911 and the heat sink.

In an optional implementation manner of the foregoing embodiment of the present invention, the communications device further includes a shielding cover. The shielding cover is located in the housing and between the circuit board and the bottom structure box.

In the foregoing embodiment of the present invention, the heat absorption portion of the heat pipe may be located at one end of the heat pipe, or at any section of the entire heat pipe. Similarly, the heat emission portion of the heat pipe may be located at one end of the heat pipe, or at any section of the entire heat pipe. Referring to FIG. 2, the heat emission portion 62 of the heat pipe 6 may be also carried in a heat dissipation block 63.

In an optional implementation manner of the foregoing embodiment of the present invention, the heat emission portion of the heat pipe is fastened to the housing. Further, the heat emission portion of the heat pipe is fastened to the top structure box or the bottom structure box. For example, the heat emission portion of the heat pipe (which may be an end of the heat pipe) is fastened, by using screws, to the top structure box or the bottom structure box, so as to fasten the entire heat pipe.

(1) Cage, Heat Emitting Device, and Connector

In an optional implementation manner of the foregoing embodiment of the present invention, the cage is fastened to the circuit board in a crimping manner.

In a specific implementation manner, the first connector is fastened to the circuit board and is communicatively connected to the circuit board. The first connector may be fastened to the circuit board in a surface-mount manner, a plug-connection manner, or the like, and is communicatively connected to the circuit board.

In a specific implementation manner, that the heat emitting device is inserted into the cage from an end of the cage facing away from the first connector and is communicatively connected to the first connector specifically includes:

the heat emitting device is inserted into the cage from the end of the cage facing away from the first connector and is interconnected to the first connector by using an edge connector or a guide pin on the front of the heat emitting device.

In the foregoing embodiment of the present invention, the cage is configured to provide shielding for the heat emitting device, and provide a guiding and limiting function in a process in which the heat emitting device is inserted into the cage and is interconnected to the first connector. In addition, the cage may further provide a function of fixing relative positions of the first connector and the heat emitting device.

(2) Second Connector Between the TEC Assembly and the Circuit Board

Figure 4:
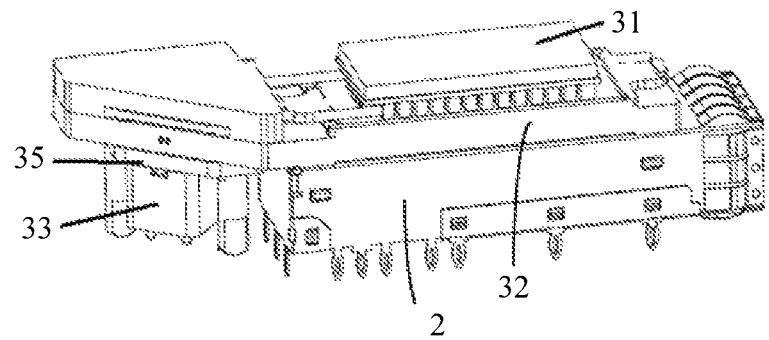
FIG. 4 is a schematic diagram of a TEC assembly in an embodiment of a heat dissipation assembly or a communications device according to the present invention.

Referring to FIG. 2, FIG. 3, or FIG. 4, the TEC assembly further includes a second connector 33. The second connector 33 and the circuit board are communicatively connected. The circuit board inputs electric power into the TEC chip 31 by using the second connector 33. In addition, in a case in which the TEC assembly is provided with a thermistor, the circuit board acquires a temperature of the thermistor by using the second connector 33, and controls, by using the second connector 33 according to the temperature of the thermistor, the TEC chip 31 to dissipate heat for or heat the heat emitting device, so as to keep the temperature of the heat emitting device at an operating temperature.

The second connector may be mounted on a metal base of the TEC assembly. The second connector may be adjacent to the end of the cage at which the first connector is disposed. The second connector may be a blind mate connector.

Referring to FIG. 4, in an optional implementation manner of the foregoing embodiment of the present invention, the TEC assembly further includes a small circuit board 35. The small circuit board 35 is configured to electrically connect a power cable of the TEC chip 31 to a contact pin of the second connector 33.

In the foregoing embodiment of the present invention, the circuit board is a board, a backplane, or a service board. The cage may also be called a cage.

In all the foregoing embodiments of the present invention, the first connector may be an electrical connector or an optical connector, and the second connector may be an electrical connector or an optical connector.

In the descriptions of the present invention, it should be understood that a position or location relationship indicated by such terms as "center", "up", "down", "front", "back", "left", "right", "vertical", "horizontal", "top", "bottom", "inside", and "outside", is a position or location relationship that is based on illustration of the accompanying drawings. These terms are merely for ease of description of the present invention and for simplified descriptions, but do not indicate or imply that an apparatus or a component referred to must have a specific position or must be constructed and operated in a specific position, and therefore, should not be understood as limitations on the present invention.

The terms "first" and "second" are merely for the purpose of description and cannot be understood to be indicating or implying relative importance, or implicitly indicating a quantity of the indicated technical feature. Therefore, a feature defined by "first" or "second" may explicitly indicate or implicitly include one or more such features. In the descriptions of the present invention, unless otherwise stated, "multiple" means two or more than two.

In the descriptions of the present invention, it should be noted that, unless otherwise clearly specified or defined, the terms "mount", "interconnect", and "connect" should be understood in the broad sense. For example, there may be a fixed connection, a detachable connection, or an integral connection; there may be a direct interconnection, an indirect interconnection via an intermediate medium, or an internal connection between two components. A person of ordinary skills in the art may understand specific meanings of the foregoing terms in the present invention according to specific circumstances.

In the descriptions of this specification, a specific feature, structure, material, or characteristic may be combined in any one or more embodiments or examples in an appropriate manner.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A heat dissipation assembly, configured to dissipate heat for a heat emitting device, wherein the heat dissipation assembly comprises:
a cage, a thermal electric cooling (TEC) assembly, a mounting kit, an elastic carrier, wherein the elastic carrier comprises a carrying base, and a material of the carrying base is an elastic material, and a heat pipe, wherein a window is provided in a side face of the cage, the TEC assembly is located on an outer side of the cage, and a cold side of the TEC assembly passes through the window and thermally communicates with the heat emitting device in the cage, so as to dissipate heat of the heat emitting device; the mounting kit is configured to mount the TEC assembly and enable the TEC assembly to move in a direction leaving or approaching the heat emitting device; and
a heat absorption portion of the heat pipe is mounted on the elastic carrier, and the heat absorption portion that is of the heat pipe and that is mounted on the elastic carrier thermally communicates with a hot side of the TEC assembly, so as to dissipate heat of the TEC assembly by using the heat pipe, wherein a side of the elastic carrier facing away from the TEC assembly presses against a caging device, and the elastic carrier is configured to: when the heat emitting device is inserted into the cage and applies an extrusion force to the outer side of the cage, and the extrusion force is transferred to the TEC assembly through the window and transferred to the elastic carrier from the TEC assembly, undergo elastic deformation and provide a reaction force to the TEC assembly and the heat emitting device.

2. The heat dissipation assembly according to claim 1, wherein there is one carrying base and at least one heat pipe, and the heat absorption portion of the at least one heat pipe is mounted on the one carrying base; or there are multiple carrying bases and multiple heat pipes, and the multiple heat pipes are mounted on the multiple carrying bases in a distributed manner.

3. The heat dissipation assembly according to claim 1, wherein the heat absorption portion of the heat pipe is mounted onto a side face of the carrying base; or the heat absorption portion of the heat pipe is mounted in a receiving groove cut in the carrying base; or the heat absorption portion of the heat pipe is embedded in the carrying base.

4. The heat dissipation assembly according to claim 1, wherein a part that is of the heat absorption portion of the heat pipe and that protrudes from the carrying base contacts the hot side of the TEC assembly; or a thermal pad is used to conduct heat between a part that is of the heat absorption portion of the heat pipe and that protrudes from the carrying base and the hot side of the TEC assembly; or the carrying base is used to conduct heat between the heat absorption portion of the heat pipe and the hot side of the TEC assembly, wherein the carrying base is a thermal conductor; or a thermally conductive medium provided in the carrying base is used to conduct heat between the heat absorption portion of the heat pipe and the hot side of the TEC assembly.

5. The heat dissipation assembly according to claim 1, wherein that a side of the elastic carrier facing away from the TEC assembly presses against a caging device specifically comprises:
the caging device is a heat sink, the elastic carrier is a thermal conductor, the side of the elastic carrier facing away from the TEC assembly presses against the heat sink, and the hot side of the TEC assembly transfers heat to the heat sink through the elastic carrier.

6. The heat dissipation assembly according to claim 1, wherein the mounting kit is mounted on the outer side of the cage.

7. The heat dissipation assembly according to claim 6, wherein the mounting kit is a fastener, the fastener comprises two oppositely disposed fastening plates and at least two elastic arms that are connected between the two fastening plates, one elastic arm of the at least two elastic arms is connected on the top of one end of the two fastening plates, another elastic arm of the at least two elastic arms is connected on the top of the other end of the two fastening plates, and the elastic arms of the fastener fasten the TEC assembly on the outer side of the cage.

8. The heat dissipation assembly according to claim 7, wherein the fastening plates of the fastener are mounted onto outer faces of two opposite side walls of the cage.

9. The heat dissipation assembly according to claim 7, wherein the at least two elastic arms of the fastener press against a metal base of the TEC assembly, wherein a part of the metal base protrudes from at least two opposite sides of the TEC assembly, and the elastic arms of the fastener press against the protruding part of the metal base.

10. The heat dissipation assembly according to claim 1, wherein the mounting kit comprises at least two support bars and at least one elastic beam, the elastic beam presses against the TEC assembly, the at least two support bars are connected to the elastic beam at one end, the support bars are mounted on a circuit board at the other end, and the cage is also mounted on the circuit board.

11. The heat dissipation assembly according to claim 10, wherein the elastic beam presses against a metal base of the TEC assembly, wherein a part of the metal base protrudes from at least two opposite sides of the TEC assembly, and the elastic beam presses against the protruding part of the metal base.

12. The heat dissipation assembly according to claim 1, wherein a location of the window is near an opening end of the cage, and the heat emitting device is inserted into the cage through the opening.

13. The heat dissipation assembly according to claim 1, wherein the heat dissipation assembly further comprises the heat emitting device, and the heat emitting device is located in the cage.

14. An optical module assembly, comprising an optical module, a connector, and the heat dissipation assembly according to claim 1, wherein the optical module serves as the heat emitting device of the heat dissipation assembly according to claim 1, the optical module and the connector are located in the cage of the heat dissipation assembly, and the optical module and the connector are communicatively connected.

15. A communications device, wherein the communications device comprises a housing, a circuit board, a connector, and the heat dissipation assembly according to claim 1, wherein the circuit board, the connector, and the heat dissipation assembly are located in the housing, the connector and the cage are disposed on a same surface of the circuit board, the connector is located in the cage at one end of the cage, and the heat emitting device is inserted into the cage from an end of the cage facing away from the connector and is communicatively connected to the connector.

16. The communications device according to claim 15, wherein the housing serves as the caging device in the heat dissipation assembly according to claim 1, and the side of the elastic carrier facing away from the TEC assembly presses against the housing.

17. The communications device according to claim 15, wherein a heat emission portion of the heat pipe thermally communicates with the housing.

18. The communications device according to claim 15, wherein the communications device further comprises a heat sink, the heat sink serves as the caging device in the heat dissipation assembly according to claim 1, the elastic carrier is a thermal conductor, the side of the elastic carrier facing away from the TEC assembly presses against the heat sink, and the hot side of the TEC assembly transfers heat to the heat sink through the elastic carrier.

19. A heat dissipation assembly, configured to dissipate heat for a heat emitting device, wherein the heat dissipation assembly comprises:
 a cage, a thermal electric cooling (TEC) assembly, a mounting kit, an elastic carrier, wherein the elastic carrier comprises a holding base, and an elastic member located on a side of the holding base facing away from the TEC assembly, and a heat pipe, wherein a window is provided in a side face of the cage, the TEC assembly is located on an outer side of the cage, and a cold side of the TEC assembly passes through the window and thermally communicates with the heat emitting device in the cage, so as to dissipate heat of the heat emitting device; the mounting kit is configured to mount the TEC assembly and enable the TEC assembly to move in a direction leaving or approaching the heat emitting device; and
 a heat absorption portion of the heat pipe is mounted on the elastic carrier, and the heat absorption portion that is of the heat pipe and that is mounted on the elastic carrier thermally communicates with a hot side of the TEC assembly, so as to dissipate heat of the TEC assembly by using the heat pipe, wherein a side of the elastic carrier facing away from the TEC assembly presses against a caging device, and the elastic carrier is configured to: when the heat emitting device is inserted into the cage and applies an extrusion force to the outer side of the cage, and the extrusion force is transferred to the TEC assembly through the window and transferred to the elastic carrier from the TEC assembly, undergo elastic deformation and provide a reaction force to the TEC assembly and the heat emitting device.

20. The heat dissipation assembly according to claim 19, wherein there is one holding base and at least one heat pipe, and the heat absorption portion of the at least one heat pipe is mounted on the one holding base; or there are multiple holding bases and multiple heat pipes, and the multiple heat pipes are mounted on the multiple holding bases in a distributed manner.

21. The heat dissipation assembly according to claim 19, wherein the heat absorption portion of the heat pipe is mounted onto a side face of the holding base; or the heat absorption portion of the heat pipe is mounted in a receiving groove cut in the holding base; or the heat absorption portion of the heat pipe is embedded in the holding base.

22. The heat dissipation assembly according to claim 19, wherein a part that is of the heat absorption portion of the heat pipe and that protrudes from the holding base contacts the hot side of the TEC assembly; or a thermal pad is used to conduct heat between a part that is of the heat absorption portion of the heat pipe and that protrudes from the holding base and the hot side of the TEC assembly; or the holding base is used to conduct heat between the heat absorption portion of the heat pipe and the hot side of the TEC assembly, wherein the holding base is a thermal conductor; or a thermally conductive medium provided in the holding base is used to conduct heat between the heat absorption portion of the heat pipe and the hot side of the TEC assembly.

* * * * *